(12) United States Patent
Novosad et al.

(10) Patent No.: US 7,697,243 B1
(45) Date of Patent: Apr. 13, 2010

(54) METHOD FOR THE DETECTION OF A MAGNETIC FIELD UTILIZING A MAGNETIC VORTEX

(75) Inventors: Valentyn Novosad, Chicago, IL (US); Kristen Buchanan, Batavia, IL (US)

(73) Assignee: The United States of America as represented by the United States Department of Energy, Washington, DC (US)

(*) Notice: Subject to any disclaimer, the term of this patent is extended or adjusted under 35 U.S.C. 154(b) by 775 days.

(21) Appl. No.: 11/530,148

(22) Filed: Sep. 8, 2006

(51) Int. Cl.
*G11B 5/39* (2006.01)
(52) U.S. Cl. .................. 360/324; 360/324.1; 360/324.2; 360/110; 324/207.21; 324/252
(58) Field of Classification Search ................ 360/110, 360/313, 324, 324.2, 326, 324.1, 324.11, 360/324.12; 324/207.21, 252
See application file for complete search history.

(56) References Cited

U.S. PATENT DOCUMENTS 4,556,925 A * 12/1985 Suenaga et al. ............. 360/327

| 7,168,081 | B2 * | 1/2007 | Yip ............................. 720/658 |
| 2001/0040778 | A1 * | 11/2001 | Abraham et al. ......... 360/324.2 |
| 2004/0150901 | A1 * | 8/2004 | Hiebert et al. ................. 360/1 |
| 2006/0132971 | A1 * | 6/2006 | Clinton et al. .............. 360/125 |
| 2009/0180218 | A1 * | 7/2009 | Bae et al. ................. 360/324.1 |

\* cited by examiner

*Primary Examiner*—Jefferson Evans
(74) *Attorney, Agent, or Firm*—Michael J. Dobbs; Bradley W. Smith; Paul A. Gottlieb

(57) ABSTRACT

The determination of the strength of an in-plane magnetic field utilizing one or more magnetically-soft, ferromagnetic member, having a shape, size and material whereas a single magnetic vortex is formed at remanence in each ferromagnetic member. The preferred shape is a thin circle, or dot. Multiple ferromagnetic members can also be stacked on-top of each other and separated by a non-magnetic spacer. The resulting sensor is hysteresis free. The sensor's sensitivity, and magnetic saturation characteristics may be easily tuned by simply altering the material, size, shape, or a combination thereof to match the desired sensitivity and saturation characteristics. The sensor is self-resetting at remanence and therefore does not require any pinning techniques.

19 Claims, 8 Drawing Sheets

METHOD FOR THE DETECTION OF A MAGNETIC FIELD UTILIZING A MAGNETIC VORTEX

GOVERNMENT INTERESTS

The United States Government has rights in this invention pursuant to Contract No. W-31-109-ENG-38, between the U.S. Department of Energy (DOE) and the University of Chicago.

FIELD OF THE INVENTION

The present invention relates to a device for the hysteresis-free, self-resetting detection of a magnetic field utilizing one or more magnetically-soft, ferromagnetic members each having a single magnetic vortex.

BACKGROUND OF THE INVENTION

Magnetic sensors are an important aspect in emerging technologies. A small, lightweight, hysteresis-free and maintenance-free magnetic sensor is key to many applications such as automotive sensors, memory modules, computer hard disk storage devices, and M-RAMs.

Magnetic sensors common today employ a variety of sensor structures. One such structure is the single member Anisotropic Magnetoresisitive ("AMR") sensor such as the structures described in U.S. Pat. Nos. 4,503,394; 4,663,684; and 4,425,593 herein fully incorporated by reference. AMR sensors are typically permalloy thin-film deposited on a silicon wafer, or other type of substrate, and patterned as elongated rectangular strips. The permalloy is generally deposited in a strong magnetic field that sets the preferred orientation of the magnetization vector in the sensor. The resistance of the strips varies with respect to an angle formed between a sensed magnetic field vector and the electrical current vector within the sensor. The strip resistance is maximized when the direction of the sensed magnetic field is parallel to the direction of the electrical current within the sensor. In order to have a more hysteresis-free response, the sensor must not change its magnetic alignment. Therefore, the sensor is generally kept in a particular magnetization alignment. If the sensor is exposed to a disturbing magnetic field, which will break down the magnetization alignment in the sensor, a strong magnetic field must be applied along the length of the thin-film to restore the sensor. Large external magnets, or smaller individual coils are often placed adjacent to the sensor to maintain the sensor's preferred orientation. Alternatively, current straps, also known as set-reset straps, may be used to restore the sensor's characteristics. The use of current straps in a magnetic field sensing device is discussed in U.S. Pat. No. 5,247,278 to Bharat B. Pant, hereby fully incorporated by reference.

Multilayered magnetic sensors typically utilize the giant magnetoresistive ("GMR") effect. The GMR effect is observed in magnetic multilayer structures, where a thin rectangular spacer layer about one nm (nanometer) thick separates two rectangular, magnetically-soft, ferromagnetic layers. The GMR effect is analogous to a pair of polarizers where aligned polarizers allow light to pass through, but crossed polarizers do not. The first ferromagnetic layer allows electrons in only one spin state to pass through easily. Likewise, the second ferromagnetic layer allows electrons in only one spin state to pass through easily. Therefore, if the first ferromagnetic layer is aligned to allow the same spin state as the second ferromagnetic layer then the electrons can easily pass through the structure, and the resistance is low. If the second ferromagnetic layer is misaligned to the first ferromagnetic layer then neither spin state can get through the structure easily and the electrical resistance is high.

The GMR effect basically measures the difference in angle between the two magnetizations in the ferromagnetic layers. Small angles (parallel alignment of electron spin) give a low resistance, and large angles (antiparallel alignment of electron spin) give a high resistance. To produce the state where the two ferromagnetic layers are parallel one applies a field large enough to magnetically saturate both layers. However, controllable rotation of the magnetization over a wide range of magnetic fields is quite difficult to achieve. The magnetization vectors rotate continuously up to some critical angle at which an irreversible transition into a collinear state occurs. Since the value of this angle is typically small, the corresponding changes in the electrical resistance due to the GMR effect are also small. Consequently, applications of such device for sensing magnetic fields would be limited due to the bipolar nature of the response (no field or in-field). For this reason magnetically-soft, ferromagnetic sensors utilizing the GMR effect are typically employed in applications that require measurements of relatively small magnetic fields. Magnetically-soft, ferromagnetic sensors utilizing the GMR effect include unpinned sandwich, antiferromagnetic multilayer, and spin valve structures.

An unpinned sandwich sensor 1, shown in FIG. 1, typically includes a first layer 5, a second layer 10, and a third layer 15. The first layer 5 is made of a magnetically-soft, ferromagnetic material. The second 10 layer is made of a nonmagnetic, electrically conductive material and typically about 3-5 nm thick. The third layer 15 is made of a magnetically-soft, ferromagnetic material. The second layer 10 is connected to and on-top of the first layer 5. The third 15 layer is connected to and on-top of the second layer 10. Permalloy is a common magnetically-soft, ferromagnetic material used in the first layer 5 and the third layer 15. Typically the second layer 10 is made of copper. An unpinned sandwich structure is usually patterned into narrow elongated rectangular strips. In order to have a more hysteresis-free response, the sensor must be maintained so the first layer 5 and the third layer 15 are magnetically antiparallel. The sensor must be reset by a magnetic field rotating the first layer 5 and the third layer 15 into antiparallel or high resistance alignment. A positive or negative external field parallel to the sensor has the same change in resistivity. An unpinned sandwich structure generally has up to a 5% change in resistivity across the sensor and is saturated by a 2.4 to 5 kA/m (30-60 Oe) magnetic field.

An antiferromagnetic sensor is exactly the same as the unpinned sandwich sensor 1, shown in FIG. 1, except the second layer is thin enough to cause antiferromagnetic coupling between the first layer 5 and the third layer 15. The second layer 10 is about 1.5-2 nm thick, for a copper spacer. This antiferromagnetic coupling causes the first layer 5 to have a magnetic moment antiparallel to the third layer 15. These antiparallel magnetic moments are required to keep the sensor operating in a high resistance state, allowing for maximum sensitivity to an external magnetic field 17. In order to have a more hysteresis-free response, these antiparallel magnetic moments must be maintained. An external magnetic field 17, if large enough, can overcome the coupling which causes this alignment and can align the magnetic moments so that all the layers are parallel, causing a low resistance state. Once this occurs the sensor must be reset by the application and subsequent removal of an external magnetic field 17 having a strong magnetic field along the length of the sensor 1. An antiferromagnetic multilayer structure generally results in a change of up to a 14% change in resistivity across the sensor.

A spin valve sensor is also similar to the unpinned sandwich sensor except a fourth layer, an antiferromagnetic layer is added. A spin valve sensor 50, shown in FIG. 2a, typically includes a first 55, second 60, third 65, and fourth 70 layer. The second layer 60 is connected to and on-top of the first layer 55. The third 65 layer is connected to and on-top of the second layer 60. The fourth layer 70 is connected to and on-top of the third layer 65. The first layer 55 is made of an antiferromagnetic layer and pins the adjacent second layer 60 into a particular direction of electron spin. The second layer 60 is made of a magnetically-soft, ferromagnetic material. The third layer 65 is made of an electrically-conducting/non-magnetic material. The fourth layer 70 is made of a magnetically-soft, ferromagnetic material. The direction of the first layer 55, the pinning layer, is usually fixed by raising the temperature of the sensor above the blocking temperature. Above the blocking temperature the second layer 60 is no longer magnetically coupled to the adjacent anti-magnetically-soft, ferromagnetic first layer 55. The sensor 50 is then cooled in an external magnetic field 17 strong enough to fix the direction of the magnetic moment in the first layer 55 (pinned layer). Since the change in magnetization in the free layer is due to rotation rather than magnetic domain wall motion, hysteresis is reduced, but still present. A spin valve sensor generally results in a change between 4 to 20% change in resistivity between the first layer 55 and the fourth layer 70. A spin valve sensor generally becomes saturated at fields 0.8 to 6 kA/m (10 to 80 Oe).

Ferromagnetic/nonmagnetic/metal-granular alloys (typically Co—Cu) are a group of materials which exhibit the GMR effect with only a single layer. At room temperature, the solubility of Co in Cu (Ag) is practically negligible, however, special preparation methods allow the production of a metastable solid solution. After thermal treatment, a more stable situation is achieved by the precipitation of small Co clusters in the Cu (Ag) matrix, thus they are called granular alloys. Granular alloys can be alloys of magnetically-soft, ferromagnetic Ni, Co, Fe with nonmagnetic Ag, Au, Cu, etc. Developing theories propose that the GMR effect arises from the spin-dependent scattering that takes place mainly at the interface. The great advantage of granular alloys sensors compared to multilayered sensors is that they are much simpler to prepare. Granular alloys do not require accurate control of the thickness of the various layers during the growth process. Granular alloys can be deposited at room temperature. However, applications of granular materials as candidates for magnetic field sensing are limited by a relatively lower GMR effect (only a few percent) and resulting low sensitivity. Furthermore, granular-alloys are also plagued by hysteresis.

Another magnetic sensor effect is the tunnel magnetoresistive (TMR) effect. Structures that have the TMR effect have the same general form as structures having the GMR effect, but the interlayer non-magnetic material is electrically insulating rather than electrically conducting. In a structure utilizing the TMR effect, a voltage is applied between magnetically-soft, ferromagnetic films cause a tunneling current to flow across the interlayer with a magnitude that depends on the relative orientation of the magnetization on both sides of the interlayer. This results in a larger change in resistivity than similar GMR effect systems. As with GMR effect, the resistance is higher for anti-alignment.

An example of a magnetic sensor using the TMR effect is the spin dependent TMR effect sensor 80, shown in FIG. 2b including a first 85, second 90, third 95, and fourth 100 layer. The second layer 90 is connected to and on-top of the first layer 85. The third layer 95 is connected to and on-top of the second layer 90. The fourth layer 100 is connected to and on-top of the third layer 95. The first layer 85 is made of an antiferromagnetic layer and pins the adjacent second layer 90 into a particular direction of electron spin. The second layer 90 is made of a magnetically-soft, ferromagnetic material. The third layer 95 is made of an electrically-insulating/non-magnetic material. The fourth layer 100 is made of a magnetically-soft, ferromagnetic material. Since the change in magnetization in the fourth layer 100 is due to rotation rather than magnetic domain wall motion, hysteresis is reduced. A spin dependent TMR effect sensor 80 structure generally results in a 10 to 25% change in resistivity between the first layer 85 and the fourth layer 100. A typical spin dependent TMR effect sensor 80 becomes saturated at fields 0.1 to 10 kA/m (1 to 100 Oe).

All of these structures suffer from hysteresis. When an external magnetic field is applied to these ferromagnetic structures, the energy is stored. As a result, the magnetization state of the magnetic material depends not only on the magnitude of an applied field, but also on the field history of the material. This causes a nonlinear relationship between the magnetic field strength (H) and the magnetic flux density (B) within such materials. If the relationship between the magnetic field strength (H) and the magnetic flux density (B) is plotted for increasing levels of field strength, it will follow a curve up until a point where further increases in the magnetic filed strength (H) will result in no further change in flux density (magnetic saturation). If the magnetic field is then reversed and increased linearly, the relationship will again follow a similar curve back towards and beyond zero flux density (B), but offset from the original curve by the remanence (absence of magnetic field). This is caused by the tendency of the ferromagnetic material to retain some of the magnetic flux density (B), which must be overcome each time the magnetic field across the ferromagnetic material is reversed.

Optimally, one would like to fabricate a sensor that is self-resetting (does not require a antiferromagnetic layer or a reset-strap) and has a hysteresis-free, tunable response.

SUMMARY OF THE INVENTION

A method and device for determining the strength and position of a magnetic field. First, a magnetically-soft, ferromagnetic material having an anisotropy constant less than $10^3$ $J/m^3$ is selected. One or more ferromagnetic members, made from the selected materials, are used to create a magnetic sensor. The ferromagnetic members each have a shape and size whereby only a single magnetic vortex is created in each member. The magnetic sensor is then exposed to a magnetic field displacing the magnetic vortex. The electrical resistance across two points on the magnetic sensor is then measured. Finally, the strength of the external magnetic field is calculated from the measured electrical resistance.

DETAILED DESCRIPTION OF THE INVENTION

Figure 1:
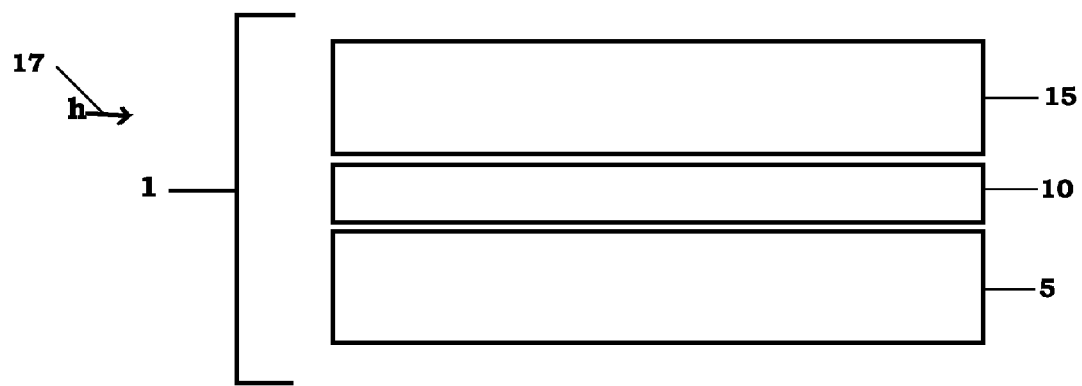
FIG. 1 is a side view of a typical unpinned sandwich sensor.
Figure 2A:
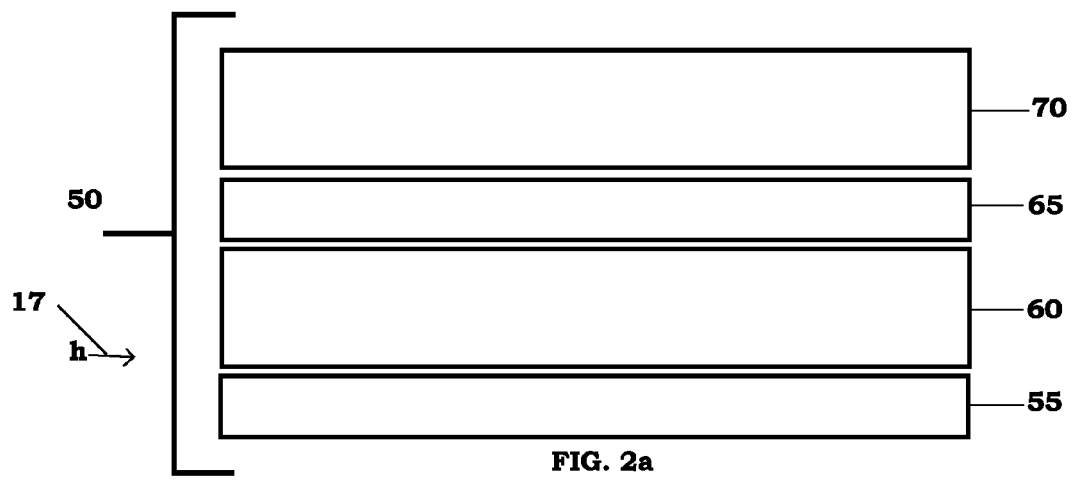
FIG. 2a is a side view of a typical spin valve sensor.
Figure 2B:
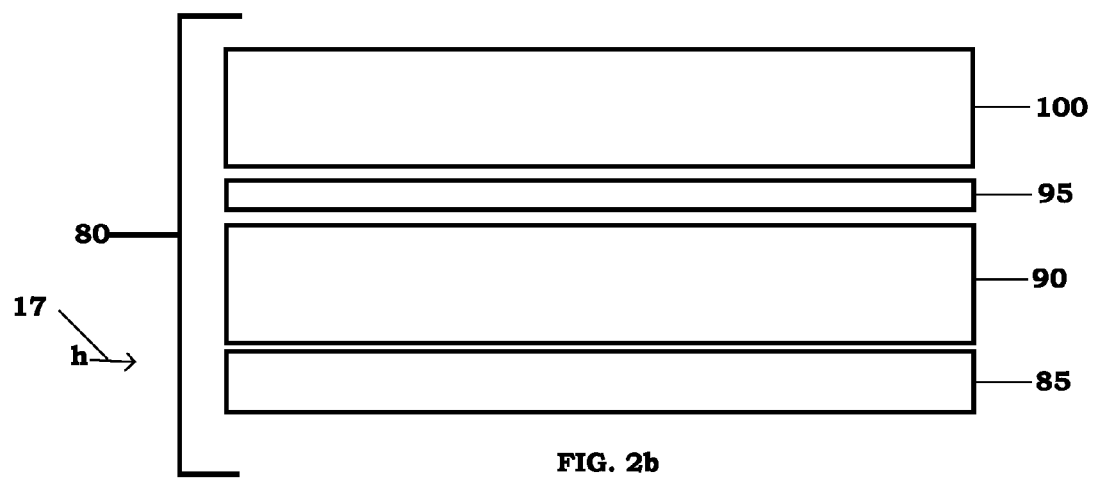
FIG. 2b is a side view of a typical spin dependent TMR effect sensor.

A magnetic sensor created from one or more members made of a magnetically-soft, ferromagnetic material. The material is magnetically-soft such that the magnetization within the material can be easily reversed. Preferably, the magnetically-soft ferromagnetic layer has an anisotropy constant less than $10^3$ J/m$^3$ (joules per cubic meter). The material is also ferromagnetic, which exhibits a long-range ordering phenomenon at the atomic level. This phenomenon causes the unpaired electron spins to line up parallel with each other in a region called a domain. Within the domain, the magnetic field is intense, but in a bulk sample the material will usually not be magnetized because the many domains will themselves be randomly oriented with respect to one another. The sensor size, shape, and material is selected such that the electron spin within the sensor align to create a single vortex at remanence (zero magnetic field). In a single vortex magnetic domains will order in a head-to-tail configuration where the magnetization is in-plane and parallel to the boundaries of the structure. The presence of a magnetic field in-plane to the magnetic sensor will displace the vortex, creating a corresponding change in the electrical resistance of the magnetic sensor. This change in electrical resistance is easily detected by a voltmeter, or any other device capable of measuring electrical resistance. Multiple ferromagnetic members may be separated by a nonmagnetic member to utilize the GMR or TMR effect.

The ferromagnetic member may be made of any magnetically-soft, ferromagnetic material. Preferably, the ferromagnetic member is made of Ni, Fe, Co, MnBi, MnSb, $FeOFe_2O_3$, $NiOFe_2O_3$, $CuOFe_2O_3$, $MgOFe_2O_3$, $MnOFe_2O_3$, $Y_3Fe_5O_{12}$, $CrO_2$, $Co_{40}Fe_{40}B_{20}$, combinations thereof, and alloys thereof. In the preferred embodiment, the ferromagnetic member is made $Ni_{80}Fe_{20}$.

The magnetic properties of magnetically-soft, ferromagnetic solids depends not only on the crystallographic nature of the system such as grain size, distribution and orientation, but also on the size and geometry of the micro-fabricated structure. Large structures usually exhibit a multi-domain magnetic structure at remanence (zero magnetic field), which leads to the magnetization reversal through magnetic domain wall displacement. The vortex-type remanent magnetization distribution is energetically favorable for micron and sub-micron magnetically-soft ferromagnetic dots. Therefore, the ferromagnetic member must be thin enough as to produce only one magnetic vortex at remanence. Likewise, the width and height of the member must also favor the vortex magnetization state.

Generally any shape having a width, length, and thickness whereby the width is approximately the same size as a length, and the thickness is smaller than the length or width will favor a single magnetic vortex. Furthermore, the thickness should be on the order of or greater than the exchange length of the ferromagnetic member. Shapes having a width to diameter ratio of 0.5 to 2 are preferable. Some examples of shapes more likely to create a single magnetic vortex include rectangles, squares, triangles, circles, and ovals. The shape of a circle (dot) most favors a stable magnetic vortex, and therefore, is the preferred shape. Distortions of these shapes may also be used and will provide only minimal interferences, since electron spin align primarily along or in parallel with the outside edge of the shape. However, the elongated rectangles previously used in AMR, GMR, and TMR effect sensors are not usable since they favor a single magnetic domain state, whereby the spin of all electrons align forming a straight line.

The calculation of a radius and thickness required for a given ferromagnetic material to support a single magnetic vortex is described in K. S. Buchanan, K. Yu. Guslienko, A. Scholl, S. D. Bader, and V. Novosad, Magnetic remanent states and magnetization reversal in patterned trilayer nanodots, Physical Review B, Vol 72, no. 134415 (2005) herein fully incorporated by reference. As the article states, the critical radius $R_c(L,d)$ separating the antiparallel SD (single domain) ground state with in-plane magnetization from double vortex ground state is $W_{||}(L/R, d/R)=W_v(L,R)$ (Shown in FIG. 3). For thick enough cylindrical dots ($L \gtrsim l_{ex}$), the energy density of a double vortex is $W_v(L,R)=(l_{ex}/R)^2[7/3-\ln(0.68\, L^{1/3} l_{ex}^{2/3}/R)$, where $l_{ex}=\mathrm{sqrt}(2A)/M_s$ is the magnetic exchange length; A is the magnetic exchange stiffness; $M_s$ is the saturation magnetization; 2R is the diameter of the ferromagnetic material; and L is the ferromagnetic material thickness. The energy of a SD (single-domain) state can be expressed as $W_{||}(\beta,\, d/R)=2\pi[F_1(\beta)-F_{int}(\beta,\, d/R)]$ where d is the spacer thickness; $\beta=L/R$; and $F_{int}(\beta, d/R)=(1/2\beta)\int_{0-\infty}[J_1(t)^2/t^2 e^{-td/R}(1-e^{-\beta t})^2 dt]$, Where $J_1(t)$ is the first-order Bessel function, and $F_1(\beta)=\int_{0-\infty}[1-(1-e^{-\beta t})/\beta t]J_1(t)^2/t\, dt$.

Figure 3:
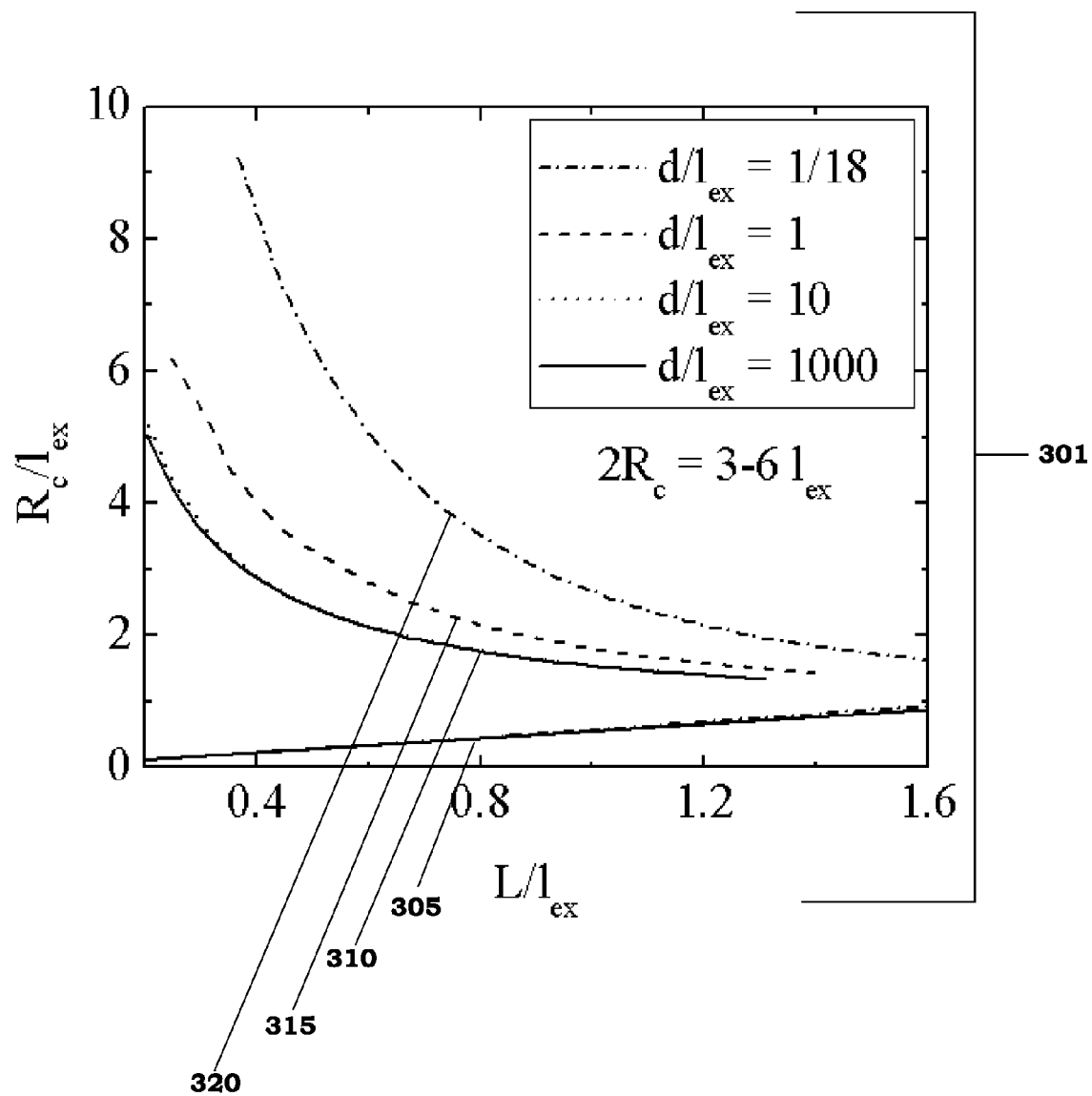
FIG. 3 shows a magnetic phase diagram for single and multi-member ferromagnetic members.

A spacer of 1000 lex, where $l_{ex}$ is the micromagnetic exchange length of the material of the ferromagnetic member, can be considered as a single ferromagnetic member. $l_{ex}$ is defined as $\mathrm{sqrt}(2A)/M_s$, where A is the exchange stiffness constant of the material of the ferromagnetic member, and Ms is the saturation magnetization of the material of the ferromagnetic member. FIG. 3 shows a magnetic phase diagram 301 for single 305 and multi-member ferromagnetic members. The y-axis is the result of the radius (R) divided by $l_{ex}$ of the material of the ferromagnetic member. The x-axis is the thickness (L) of the ferromagnetic member divided by lex. Under a curve is a single magnetic domain state (either horizontally, or vertically). If the ferromagnetic member has a radius and thickness above a curve the desired single magnetic vortex will form at remanence.

For a circular $Ni_{80}Fe_{20}$ magnetically-soft, ferromagnetic member, a thickness of about 8-150 nm thickness with a diameter of about 100 nm to 2500 nm is known to work, but not all combinations will work, as shown in FIG. 3. Circular $Ni_{80}Fe_{20}$ magnetically-soft, ferromagnetic members having a diameter of about 1000 nm with a thickness of 20-60 nm are preferable.

The ferromagnetic member may also have an oval-type shape. The required size of the oval to form a single magnetic vortex may be approximated to that of a circle using the average-in-plane dimension for the oval. The oval shape has a hard axis and an easy axis. The easy axis is the elongated in-plane portion of the oval shape. The hard axis is the shorter in-plane portion of the oval shape. The easy axis of an oval-type shape ferromagnetic member will be more susceptible to a magnetic field than the corresponding hard axis, allowing for better determination of the direction of a detected magnetic field.

Figure 4A:
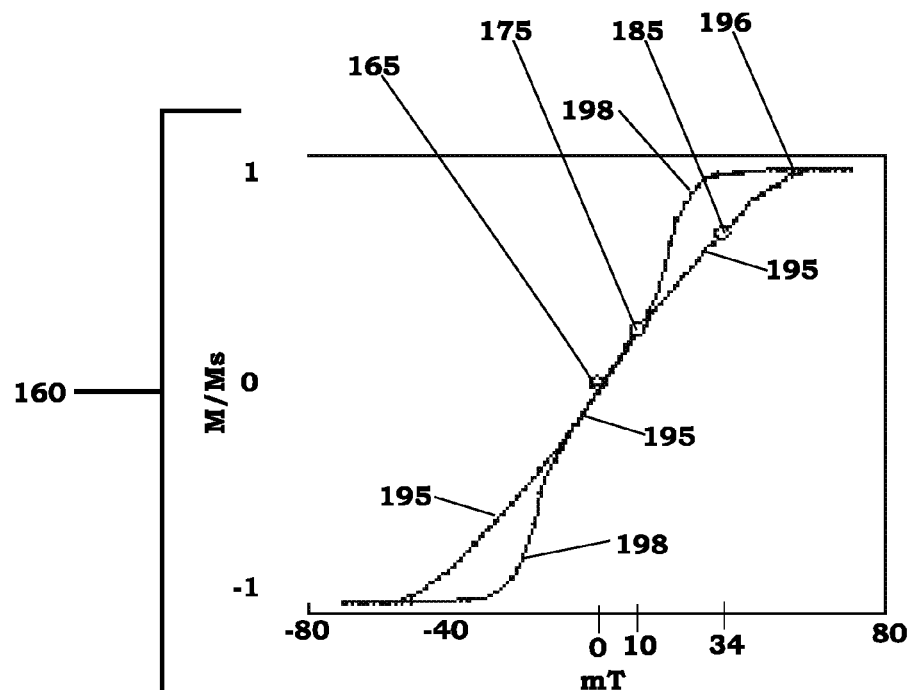
FIG. 4a is a hysteresis loop for a 60 nm thick circular ferromagnetic member having a 1000 nm diameter.
Figures 4B, 4C, 4D:
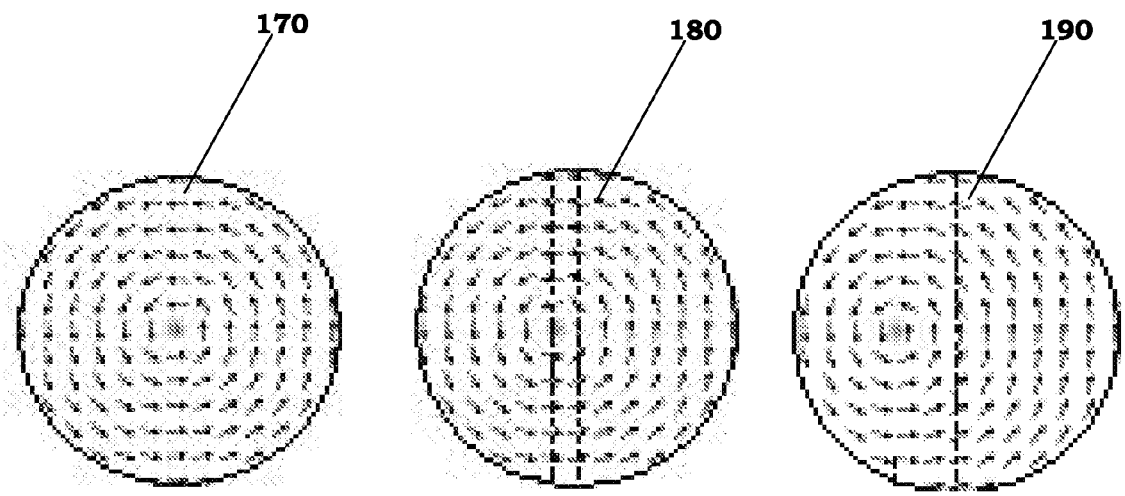
FIG. 4b is a magnetic spin structure for a 60 nm thick circular ferromagnetic member having a 1000 nm diameter at remanence.
FIG. 4c is a magnetic spin structure for a 60 nm thick circular ferromagnetic member having a 1000 nm diameter exposed to an external magnetic field of about 10 mT.
FIG. 4d is a magnetic spin structure for a 60 nm thick circular ferromagnetic member having a 1000 nm diameter exposed to an external magnetic field of about 34 mT.

In a ferromagnetic member having a single magnetic vortex at remanence, the magnetic vortex will be centered in the ferromagnetic member, as shown in FIG. 4b. When exposed to an external magnetic field smaller than the annihilation field, the magnetic vortex core simply displaces according to the balance between magnetostatic and Zeeman energy, as shown in FIG. 4c and FIG. 4d. Due to strong exchange interaction present in magnetically-soft, ferromagnetic solids, the magnetic vortex spin structure remains almost unchanged during this process. Furthermore, the magnetic vortex core displacement is completely reversible below the annihilation field. This results in a completely linear portion of magnetic field response within about 0.5 of the magnetization of saturation as shown in FIG. 4a. Moreover, the slope of this linear part of the loop, which is typically described as an initial magnetic susceptibility equal to dM/dH, is strongly size-dependent. This offers a unique opportunity to tailor the magnetic properties by precisely varying the disk geometry during the micro-fabrication process.

The magnetic vortex core displacement aligns a large amount of electron spins within the ferromagnetic member. Electron spins having a direction parallel or antiparallel to an electrical current offers the highest electrical resistance. Electron spins having a direction perpendicular to the electrical current offer the least resistance whereby electrons flow more easily within the ferromagnetic member, thereby causing a measurable and predictable electrical resistance change within the ferromagnetic member. Up to 1% change in electrical resistance has been measured for a single member single magnetic vortex sensor. The amount of change of resistance in a given magnetic field only depends on the size of the ferromagnetic member. The change in resistance can be measured by numerous methods, such as applying a current and measuring the voltage across the sensor and using Ohm's Law to calculate the resulting resistance from the known voltage and current. Similarly, a Wheatstone bridge may be used. An analog-to-digital (ND) converter can be used to convert the voltage across the sensor into a digital format which can be read into a computer. This digital format can then be processed by a computer to calculate the resistance, and the magnetic field.

In a preferred embodiment, the resistance of the sensor is measured at remanence and the sensor exposed to known magnetic fields below the annihilation field. The measurements may be used to construct a table, or an equation whereby the magnetic field may be determined by the resistance of the sensor. The resistance of the material may also be calculated using known properties of the sensor material. The resistance of the material is related to the square of the cosine of the angle formed between the direction of the electrical current and the average magnetic moment. Other methods known in the art may also be used.

Figure 5A:
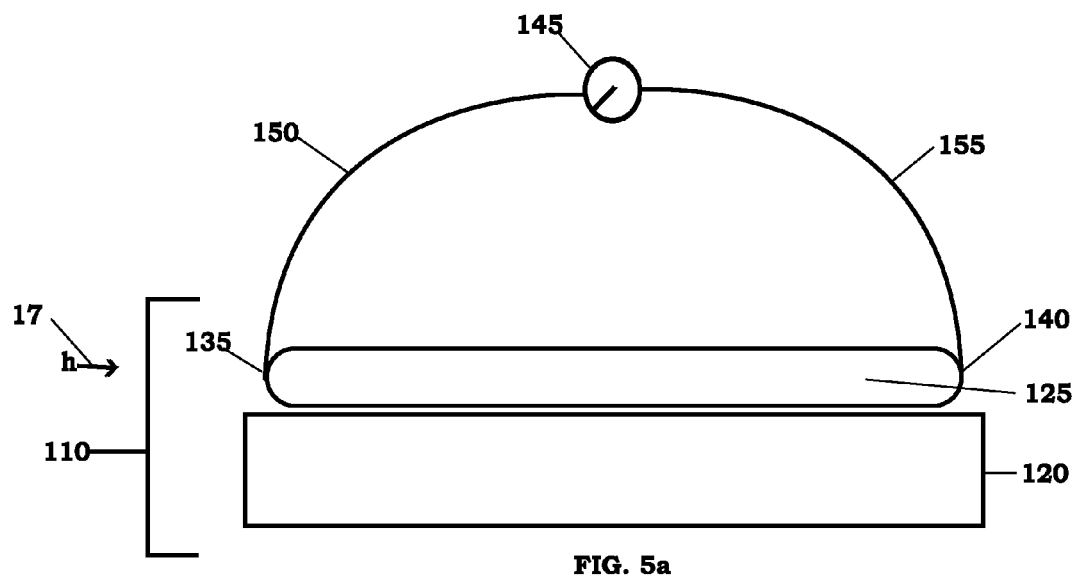
FIG. 5a is a side view of an embodiment of a single magnetic vortex sensor.
Figure 5B:
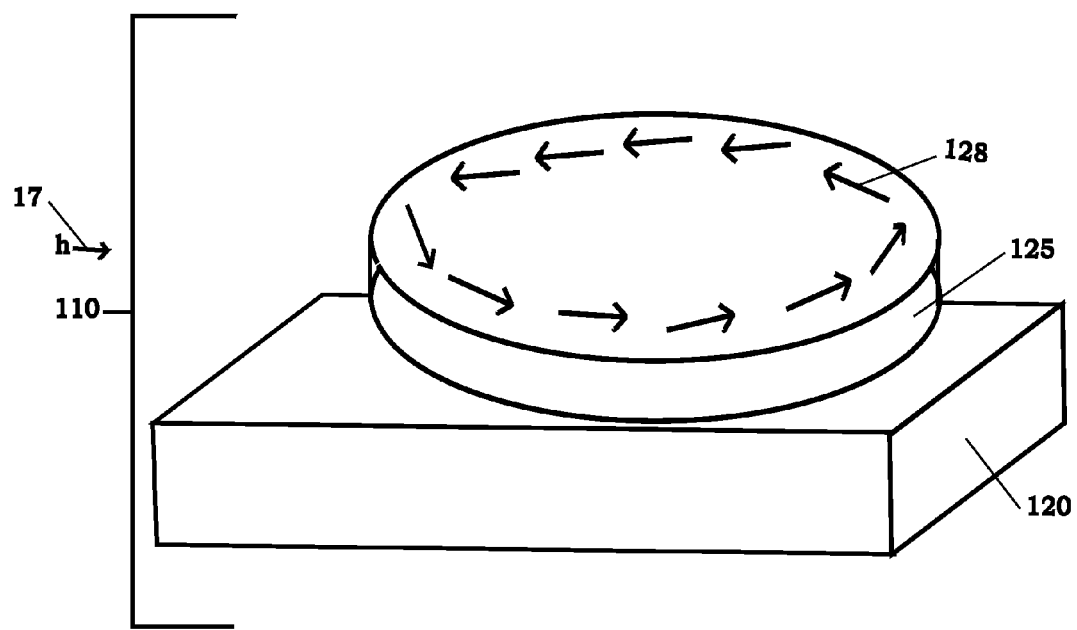
FIG. 5b is a side view of an embodiment of a single magnetic vortex sensor, depicting the magnetic vortex.

One embodiment of a single vortex magnetic sensor 110 utilizing a single magnetic vortex is the thin-film sensor shown in FIG. 5a and FIG. 5b. The single vortex magnetic sensor 110 has a substrate 120 and a magnetically-soft, ferromagnetic member 125. The ferromagnetic member 125 can be constructed from Ni, Fe, Co, MnBi, MnSb, $FeOFe_2O_3$, $NiOFe_2O_3$, $CuOFe_2O_3$, $MgOFe_2O_3$, $MnOFe_2O_3$, $Y_3Fe_5O_2$, $CrO_2$, $Co_{40}Fe_{40}B_{20}$, combinations thereof, and alloys thereof. Preferably, the ferromagnetic member 125 is shaped into a small circular dot having a 1000 nm diameter, a 60 nm thickness, and made of $Ni_{80}Fe_{20}$. A different shape and size may also be used, but the shape and size must create a stable magnetic vortex 128 at remanence. "Scaling Approach to the Magnetic Phase Diagram of Nanosized Systems" by Castro, Retamal, and Vargas (88 PhysRevLett 237202) describes a method of obtaining a phase diagram of the lowest energy state of a magnetic particles, hereby fully incorporated by reference. In the preferred embodiment, the single vortex magnetic sensor 110 is fabricated using e-beam lithography procedure and lift-off, Ar ion milling technique, or a combination thereof.

FIG. 4a shows the hysteresis loop 160 for the single vortex magnetic sensor 110. At remanence (zero magnetic field) 165 the magnetic vortex 128 will form in the center of the member 170, as shown in FIG. 4b.

Looking to FIG. 5b and FIG. 4a, on the application of an external magnetic field 17 of about 10 mT (Tesla) 175 on the same plane as the magnetic vortex 128, the magnetic vortex of the magnetically-soft, ferromagnetic member 125 will displace 180, as shown in FIG. 4c. On further application of an external magnetic field 17 of about 34 mT 185 the vortex of the magnetically-soft, ferromagnetic member 125 will further displace 190, as shown in FIG. 4d. It is important to note that the magnetization of the member will remain across a linear line 195 so long as the external magnetic field 17 is below the annihilation field, about 50 mT 196.

If the external magnetic field 17 reaches a level equal to or stronger than the annihilation field, the sensor will have a nonlinear response 198 until a the magnetic vortex is reestablished, for example around 10 mT 175. Ideally, once exposed to an annihilation field, the sensor should be brought back to a remanence (zero magnetic field) 165 to properly reset the sensor.

Looking to FIG. 5a, the displacement of the magnetic vortex corresponds to a measurable change in electrical resistance. This change in electrical resistance is measured by the application of a current through the magnetically-soft, ferromagnetic member 125 across two points (135 and 140). The two points (135 and 140) are preferably spaced farthest from each other so that electrical resistance is measured across the entire single vortex magnetic sensor 110. The voltage across these two points (135 and 140) is then measured by a device capable of measuring voltage 145, such as a volt meter, or an ND converter. The device capable of measuring voltage 145 is connected by two wires (150 and 155) to two points (135 and 140) on the magnetically-soft, ferromagnetic member 125. Ohm's law is then used to calculate the resistance of the member from the voltage reading and the current applied. The sensitivity and range of operation of the sensor can be changed by increasing or decreasing the diameter and thickness of the ferromagnetic member 125.

Multiple magnetically-soft, ferromagnetic members may be stacked to take advantage of the GMR or TMR effect while maintaining hysteresis-free operation. A non-magnetic spacer must be placed between magnetically-soft, ferromagnetic members to settle them into anti-parallel vortex spin states at remanence (zero magnetic field). The non-magnetic spacer may be made of an electrically conducting material (GMR effect) or an electrically insulating material (TMR effect). At remanence (zero magnetic field), the ferromagnetic members will each form a single magnetic vortex having spins antiparallel to each other.

The calculation and range of radius and thickness values required for each ferromagnetic member to support a single magnetic vortex is similar to the single ferromagnetic member and described in K. S. Buchanan, K. Yu. Guslienko, A. Scholl, S. D. Bader, and V. Novosad, *Magnetic remanent states and magnetization reversal in patterned trilayer nanodots*, Physical Review B, Vol 72, no. 134415 (2005), herein fully incorporated by reference. However, the ferromagnetic members and the non-magnetic members will interact with each other, further restricting the corresponding usable shape, size, and materials. FIG. 3 shows a magnetic phase diagram 301 for multi-member ferromagnetic members having different values, normalized to $l_{ex}$ (exchange length), for radius ($R/l_{ex}$), thickness ($L/l_{ex}$), and size of the nonmagnetic spacing member ($d/l_{ex}$) between ferromagnetic members. $l_{ex}$ is defined as $sqrt(2A)/M_s$, where A is the exchange stiffness constant of the material, and $M_s$ is the saturation magnetization. The y-axis is the result of the radius (R) of the ferromagnetic member divided by the micromagnetic exchange length ($l_{ex}$). The x-axis is the thickness (L) of the ferromagnetic member divided by the micromagnetic exchange length ($l_{ex}$). Shown in FIG. 3 is a single ferromagnetic member curve 305, a first tri-member curve 310 for $d/l_{ex}=10$, a second tri-member curve 315 for $d/l_{ex}=1$, and a third tri-member curve 320 for $d/l_{ex}=1/18$. Under the curve appropriate for the spacing between ferromagnetic members, is a single magnetic domain state (either horizontally, or vertically). Above the appropriate curve the desired single magnetic vortex where a single magnetic vortex will be the lowest energy state in each ferromagnetic member, and therefore will form in remanence.

Figure 6A:
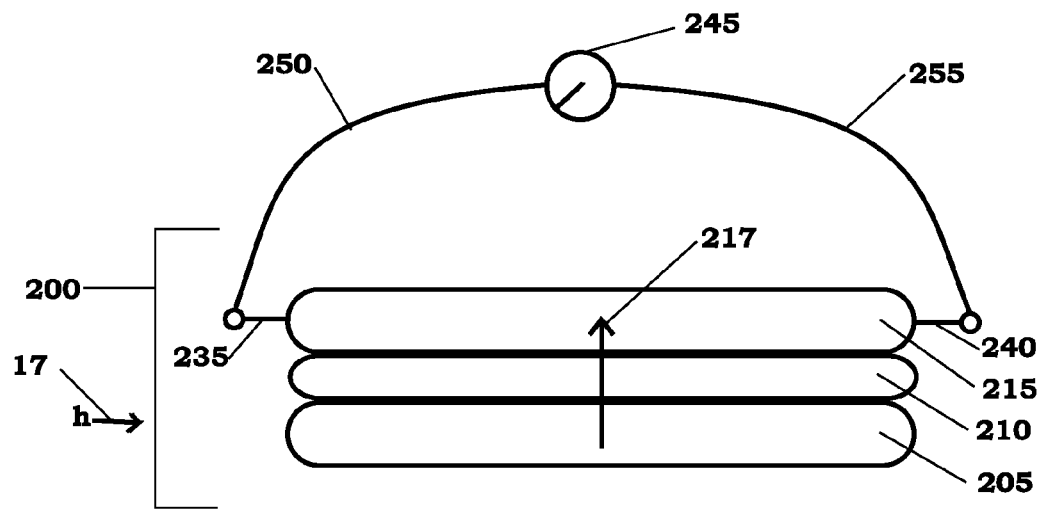
FIG. 6a is a side view of one embodiment of a multi-member GMR effect sensor.
Figure 6B:
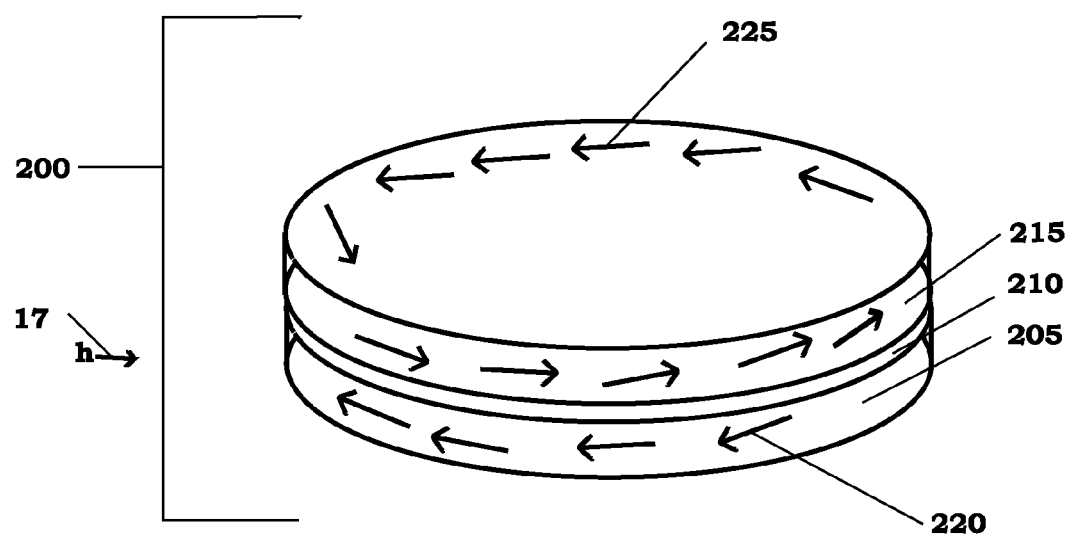
FIG. 6b is a three-dimensional view of one embodiment of a multi-member GMR effect sensor, depicting the magnetic vortex.
Figure 7A:
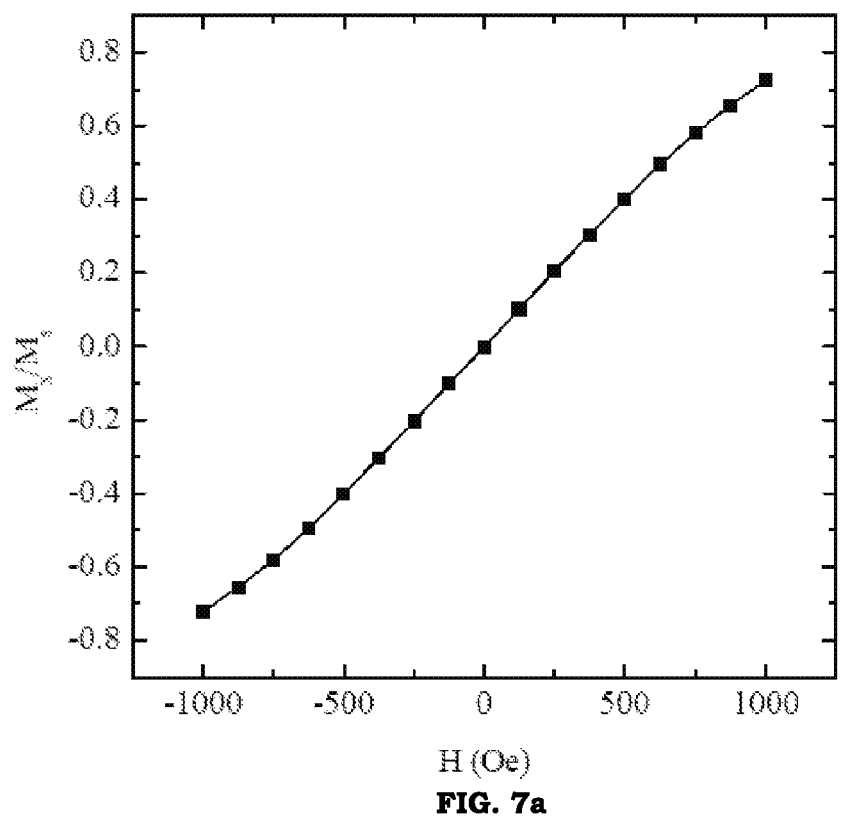
FIG. 7a is a hysteresis loop for a magnetic vortex tri-member sensor having two circular ferromagnetic members each having about a 1000 nm diameter and about a 40 nm thickness, separated by a circular non-magnetic spacer having about a 1000 nm diameter and about a 1 nm thickness.

An embodiment of a multi-member GMR effect sensor 200 is shown in FIG. 6a and FIG. 6b. The sensor 200 has a first member 205 made of a magnetically-soft, ferromagnetic material, a second member 210 made of a non-magnetic, electrically conductive material and a third member 215 made of a magnetically-soft, ferromagnetic material. The first 205, and the third 215 members (ferromagnetic members) are Ni, Fe, Co, MnBi, MnSb, $FeOFe_2O_3$, $NiOFe_2O_3$, $CuOFe_2O_3$, $MgOFe_2O_3$, $MnOFe_2O_3$, $Y_3Fe_5O_{12}$, $CrO_2$, $Co_{40}Fe_{40}B_{20}$, combinations thereof, and alloys thereof. In the preferred embodiment, the first 205, and the third 215 members (ferromagnetic members) are $Ni_{80}Fe_{20}$. The first 205, and the third 215 members (ferromagnetic members) are each about 8-150 nm thick, and about 100 nm to 2500 nm wide. Preferably, the first 205, and the third 215 members (ferromagnetic members) are shaped into small circular dots with about a 1000 nm diameter, and about a 20-60 nm thickness. The diameter and thickness may be adjusted based on the sensitivity and range of operation desired. Preferably, the second member 210 is shaped into a small circular dot with about a 1000 nm diameter, and about 1 nm thick. The sensor 200 is preferably fabricated using e-beam lithography procedure and lift-off, Ar ion milling technique or a combination thereof. A first magnetic vortex 220 will form within the first member 205. A second magnetic vortex 225, antiparallel to the first magnetic vortex 220, will form within the third member 215. On the application of an external magnetic field 17 in the same plane as the sensor 200, the magnetization of the sensor will change in a linear fashion as shown in FIG. 7a. This magnetization corresponds to a displacement in the first magnetic vortex and second magnetic vortex causing a change in electrical resistance across the sensor in-plane with the external magnetic field 17.

Figure 7B:
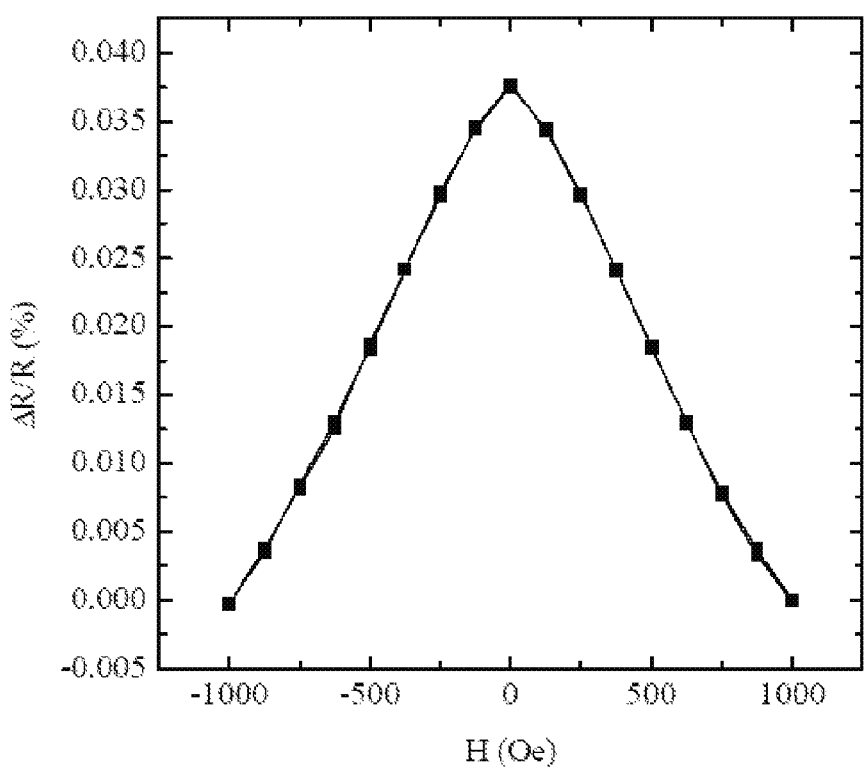
FIG. 7b is a magneto-resistance curve for a magnetic vortex tri-member sensor having two circular ferromagnetic members each having about a 1000 nm diameter and about a 40 nm thickness, separated by a circular non-magnetic spacer having about a 1000 nm diameter and about a 1 nm thickness.

This change in electrical resistance is shown in FIG. 7b, as applied to FIG. 6a and FIG. 6b. This change in electrical resistance is measured by applying a known current 217 through a first electrode 235 and second electrode 240, determining the voltage difference across the first electrode 235 and the second electrode 240, and using Ohm's Law to calculate the resulting resistance from the known voltage and current. The first electrode 235 and second electrode 240 are preferably spaced farthest from each other so the electrical resistance is measured across the entire sensor 200. The voltage across the first electrode 235 and second electrode 240 can then be measured by a device capable of measuring voltage 245, such as a volt meter, or an ND converter. The device capable of measuring voltage 245 is connected by two wires (250 and 255) to the first electrode 235 and the second electrode 240 respectively.

The sensitivity and range of operation of the sensor 200 can be tuned by altering the material, size, or shape of the first 205, second 210, or third member 215. For instance increasing the thickness or diameter of the first member 205, and the third member 215 (ferromagnetic members) will increase the magnetization saturation level allowing stronger magnetic fields to be detected. Likewise, decreasing the thickness or diameter allows for increased sensitivity to a magnetic field. When tuning the sensor 200, the shape, size, and material must be kept within the bounds so the single magnetic vortex within each of the first member 205, and the third member 215 (ferromagnetic members) is maintained.

Figure 8A:
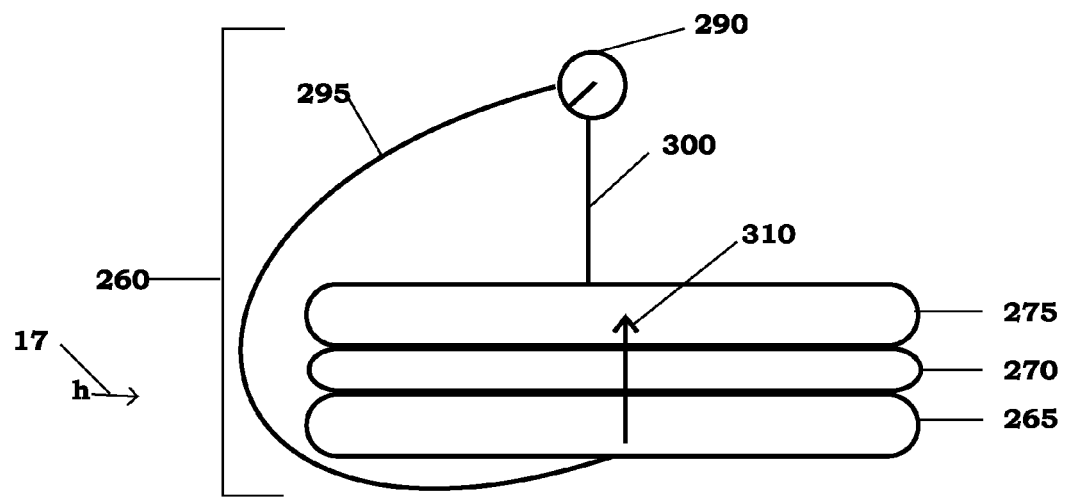
FIG. 8a is a side view of an embodiment of a multi-member TMR effect sensor.
Figure 8B:
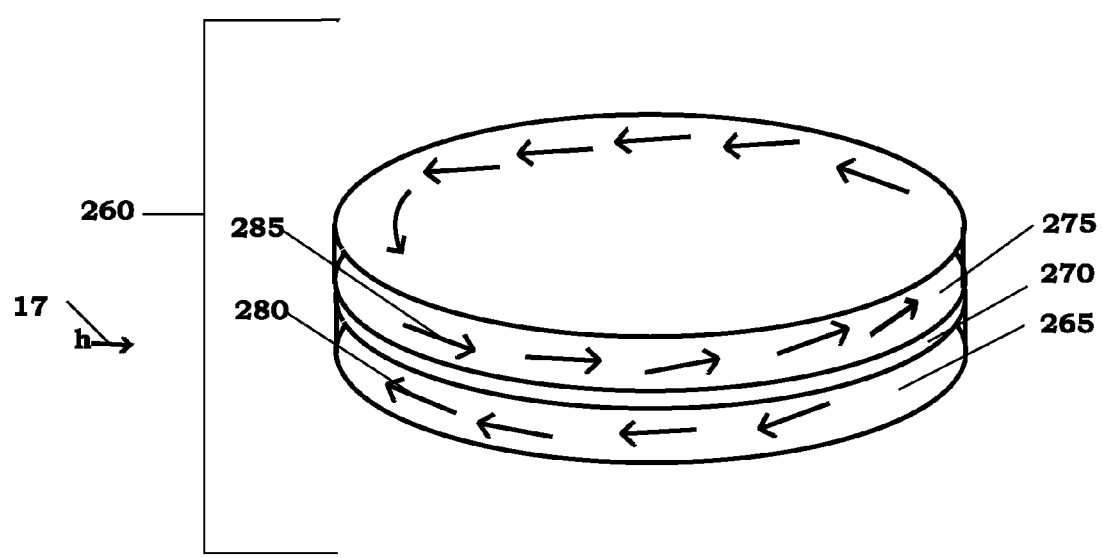
FIG. 8b is a three-dimensional view of an embodiment of a multi-member TMR effect sensor, depicting the magnetic vortex.

An embodiment of a multi-member TMR effect sensor 260 is shown in FIG. 8a and FIG. 8b. The sensor has a first member 265 made of a magnetically-soft, ferromagnetic material, a second member 270 made of a non-magnetic/electrically insulating material and a third member 275 made of a magnetically-soft, ferromagnetic material. The first 265, second 270, third 275 members are shaped into a small circular dots each having a 1000 nm diameter, a thickness of 20-60 nm, and made of $Ni_{80}Fe_{20}$. The sensor 260 is fabricated using e-beam lithography procedure and lift-off, Ar ion milling technique, or a combination thereof. A first magnetic vortex 280 will form in the first member 265. A second magnetic vortex 285 will form in the third member 275 in a direction opposite of the first magnetic vortex 265.

On the application of an external magnetic field 17 on the same plane as the first magnetic vortex 280 and second magnetic vortex 285, the electrical resistance between the first member 265 and third member 275 will change. This change in electrical resistance is measured by the application of a current 310 through the first member 265, second member 270, and third member 275. The voltage across the first member 265 and the third member 275 can then be measured by a device capable of measuring voltage 290, such as a volt meter, or an ND converter. The device capable of measuring voltage 290 is connected by two wires (295 and 300) to the first member 265 and the third member 275. The resistance is then calculated using Ohm's Law using the known current and voltage. The sensitivity and range of operation of the sensor can also be tuned by altering the diameter and thickness of the first member 265 and the third member 275 as with the multi-member GMR effect sensor.

Multiple ferromagnetic members may be positioned in numerous configurations. For example, multiple ferromagnetic members may be placed in series and connected in series to increase the sensitivity of the sensor. In another embodiment, multiple ferromagnetic members, preferably having an oval shape, are positioned so that one ferromagnetic member is perpendicular to another ferromagnetic sensor. This will allow any magnetic field to be detected regardless of its direction.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. §112, ¶ 6. In particular, the use of "step of" in the claims herein is not intended to invoke the provisions of 35 U.S.C. §112, ¶ 6.

What is claimed is:

1. A method of determining the strength and position of a magnetic field comprising the steps of:
    a) selecting a magnetically-soft, ferromagnetic material having an anisotropy constant less than $10^3$ J/m$^3$;
    b) constructing one or more ferromagnetic members from said selected ferromagnetic material;
    c) employing said one or more ferromagnetic members to produce a magnetic sensor such that each ferromagnetic member from said magnetic sensor has a shape and size whereby only a single magnetic vortex is formed within each ferromagnetic member at remanence;
    d) exposing a vortex from a ferromagnetic member of said magnetic sensor to an external magnetic field;
    e) measuring an electrical resistance across two points on said magnetic sensor;
    f) calculating the strength of said external magnetic field from said measured electrical resistance; and
    g) said shape and said size is a circle having a thickness between about 8 nm and 150 nm and a diameter between about 100 nm and 2500 nm.

2. The method of producing a magnetic field sensor of claim 1 whereas said ferromagnetic member is selected from the group consisting of Ni, Fe, Co, MnBi, MnSb, FeOFe$_2$O$_3$, NiOFe$_2$O$_3$, CuOFe$_2$O$_3$, MgOFe$_2$O$_3$, MnOFe$_2$O$_3$, Y$_3$Fe$_5$O$_{12}$, CrO$_2$, Co$_{40}$Fe$_{40}$B$_{20}$, combinations thereof, and alloys thereof.

3. The method of producing a magnetic field sensor of claim 1 whereby said ferromagnetic material is Ni$_{80}$Fe$_{20}$.

4. The method of producing a magnetic field sensor of claim 1 whereby said shape and said size is a circle having a thickness between about 20 nm and 60 nm and a diameter of about 1000 nm.

5. The method of producing a magnetic field sensor of claim 1 whereby:
    a) said one or more ferromagnetic members is a plurality of ferromagnetic members; and
    b) further comprising the step of positioning said ferromagnetic members of said magnetic sensor such that said ferromagnetic members of said magnetic sensor are stacked on-top of each other and separated by non-magnetic members constructed from a non-magnetic material.

6. The method of producing a magnetic field sensor of claim 1 whereby:
    a) said one or more ferromagnetic members is a plurality of ferromagnetic members; and
    b) further comprising the step of positioning said plurality of ferromagnetic members whereas at least one ferromagnetic member is perpendicular to another ferromagnetic member.

7. A method of determining the strength and position of a magnetic field comprising the steps of:
    a) selecting a magnetically-soft, ferromagnetic material having an anisotropy constant less than $10^3$ J/m$^3$;
    b) constructing one or more ferromagnetic members from said selected ferromagnetic material;
    c) employing said one or more ferromagnetic members to produce a magnetic sensor such that each ferromagnetic member from said magnetic sensor has a shape and size whereby only a single magnetic vortex is formed within each ferromagnetic member at remanence;
    d) exposing a vortex from a ferromagnetic member of said magnetic sensor to an external magnetic field;
    e) measuring an electrical resistance across two points on said magnetic sensor;
    f) calculating the strength of said external magnetic field from said measured electrical resistance; and
    g) said shape and said size is an oval having a thickness between about 8 nm and 150 nm and an average in-plane dimension between about 100 nm and 2500 nm.

8. The method of producing a magnetic field sensor of claim 7 whereby said shape is an oval having a thickness between about 20 nm and 60 nm and an average in-plane dimension of about 1000 nm.

9. The method of producing a magnetic field sensor of claim 7 whereby:
    a) said one or more ferromagnetic members is a plurality of ferromagnetic members; and
    b) further comprising the step of positioning said ferromagnetic members of said magnetic sensor such that said ferromagnetic members of said magnetic sensor are stacked on-top of each other and separated by non-magnetic members constructed from a non-magnetic material.

10. The method of producing a magnetic field sensor of claim 7 whereby:
    a) said one or more ferromagnetic members is a plurality of ferromagnetic members; and
    b) further comprising the step of positioning said plurality of ferromagnetic members whereas at least one ferromagnetic member is perpendicular to another ferromagnetic member.

11. A multi-member magnetic sensor comprising:
    a) a first member, a second member, and a third member;
    b) said a first member magnetically-soft, ferromagnetic having an anisotropy constant less than $10^3$ J/m$^3$;
    c) said second member non-magnetic;
    d) said third member magnetically-soft, ferromagnetic having an anisotropy constant less than $10^3$ J/m$^3$;
    e) said first member connected to said second member;
    f) said third member connected to said second member;
    g) said second member between said first member and said third member;
    h) said first member, said second member, and said third member each having a shape and size selected such that a single magnetic vortex is created within each of said first member and said third member when at remanence; and i) a resistance measuring device having a means for measuring an electrical resistance across said first member and said third member.

12. The multi-member magnetic sensor in claim 11 whereby said first member and said third member are made from a magnetically-soft, ferromagnetic material from the group consisting of Ni, Fe, Co, MnBi, MnSb, $FeOFe_2O_3$, $NiOFe_2O_3$, $CuOFe_2O_3$, $MgOFe_2O_3$, $MnOFe_2O_3$, $Y_3Fe_5O_{12}$, $CrO_2$, $Co_{40}Fe_{40}B_{20}$, combinations thereof, and alloys thereof.

13. The magnetic sensor in claim 11 whereby said first member and said third member are $Ni_{80}Fe_{20}$.

14. The magnetic sensor in claim 11 whereby said shape of said first member and said shape of said third member is from the group consisting of squares, rectangles, triangles, circles, and ovals.

15. The magnetic sensor in claim 11 whereby said shape of said first member and said shape of said third member is a circle having a thickness between 8 nm and 150 nm and a diameter between 100 nm and 2500 nm.

16. The magnetic sensor in claim 11 whereby said shape of said first member and said shape of said third member is a circle having a thickness between 20 nm and 60 nm and a 1000 nm diameter.

17. The magnetic sensor in claim 11 whereby said shape of said first member and said shape of said third member is a circle having a 60 nm thickness and a 1000 nm diameter.

18. The magnetic sensor in claim 11 whereby said second member is made from a material that is electrically conducting.

19. The magnetic sensor in claim 11 whereby said second member is made from a material that is electrically insulating.

* * * * *